(12) United States Patent
Kuzniz

(10) Patent No.: US 11,687,005 B1
(45) Date of Patent: Jun. 27, 2023

(54) PREPARING A SUBSTRATE WITH PATTERNED REGIONS FOR IMMERSION BASED INSPECTION

(71) Applicant: Applied Materials Israel Ltd., Rehovot (IL)

(72) Inventor: Tai Kuzniz, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 17/671,468

(22) Filed: Feb. 14, 2022

(51) Int. Cl.
   *G03F 7/20* (2006.01)
   *G03F 7/00* (2006.01)
   *C23C 16/455* (2006.01)

(52) U.S. Cl.
   CPC .... *G03F 7/70341* (2013.01); *C23C 16/45557* (2013.01); *G03F 7/70616* (2013.01)

(58) Field of Classification Search
   CPC ............. G03F 7/70341; G03F 7/70616; C23C 16/45557
   See application file for complete search history.

(56) References Cited

U.S. PATENT DOCUMENTS

| 7,705,979 | B2 | 4/2010 | Veis | |
| 9,280,063 | B2* | 3/2016 | Kunnen | G03F 7/707 |
| 2007/0256785 | A1* | 11/2007 | Pamarthy | H01J 37/3244 |
| | | | | 438/689 |
| 2018/0348643 | A1* | 12/2018 | Nishinaga | G03F 7/706 |

* cited by examiner

*Primary Examiner* — Hung V Nguyen
(74) *Attorney, Agent, or Firm* — Kilpatrick Townsend & Stockton LLP

(57) ABSTRACT

A method and a system for preparing a substrate with three dimensional features for immersion based inspection. The method may include (a) receiving, by a secondary chamber, an article that includes the substrate, a housing, and a transparent element; wherein the transparent element is sealingly coupled to the housing to provide a sealed inner space; wherein the sealed inner space may include a gap between a first surface of the substrate to a second surface of the transparent element; wherein the gap is filled with gas during the receiving of the article; (b) evacuating the gas from the gap while reducing a pressure within the secondary chamber and maintaining an integrity of the transparent element; (c) filling the gap with fluid while increasing the pressure within a secondary chamber inner space and maintaining an integrity of the transparent element; and (d) outputting the article from the secondary chamber.

15 Claims, 13 Drawing Sheets

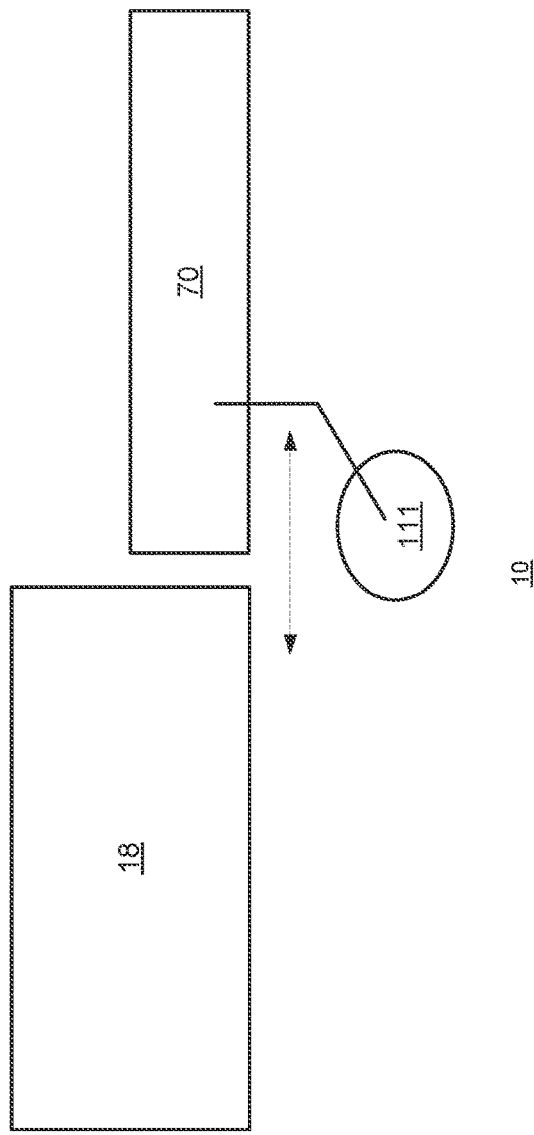

PREPARING A SUBSTRATE WITH PATTERNED REGIONS FOR IMMERSION BASED INSPECTION

BACKGROUND

During the last decades, the sizes of wafer features has dramatically decreases. The dimension of these feature is well below one micron and is expected to shrink during the next couple of years. Accordingly, the importance of resolution enhancing microscopy solutions has dramatically increased.

The resolution of a microscope is dependent upon various parameters including the numerical aperture (NA) of the microscope and especially the numerical aperture of the objective lens of the microscope. The numerical aperture can be increase by increasing the refractive index of a medium between the wafer and the lens.

One method of immersion microscopy includes placing a drop of fluid between an objective lens of an inspection system and between an inspected wafer. The inspection process includes scanning the wafer by introducing a relative movement between the wafer and the objective lens.

A first surface of the wafer includes patterned regions that include three dimensional features. When these features are being scanned the drop of fluid can be deformed and, additionally or alternatively, can lose fluid in an unexpected manner. In addition, the scanning speed can be limited in order to limit drop deformations.

U.S. Pat. No. 7,705,979 illustrates a system and method for immersion based inspection in which a wafer is located within a housing of an article. A transparent element is positioned on the housing and the drop of fluid may travel along a smooth upper surface of the transparent element. A second fluid is used to fill a gap between the wafer and the transparent element.

Gas may be trapped in the three dimensional features of the wafer. Filling the gap with the second fluid does not evacuate the trapped gas—thereby maintaining trapped gas within the fluid.

The trapped gas locally reduces the numerical aperture of the imaging, may cause a local loss of information, and may also introduce differences between the radiation returned from different locations of the wafer.

For example—a gas bubble trapped at the bottom of a via of a high aspect ratio may prevent the microscope from obtaining signals from the bottom of the via.

Yet for another example—assuming that there are two ideally identical vias—one via is partially filled with a gas bubble—and a second via if fully filled by the fluid.

The gas bubble will introduce a significant difference between the radiation returned from the first via to the radiation returned from the second via—and may lead to falsely declaring one of the vias as defective.

FIG. 1 is an example of three prior art vias—first via 81, second via 82 and third via 83. An air bubble 88 is trapped (by liquid 91 located on a substrate) at the bottom of the first via 81. The air bubble 88 may prevent a microscope from viewing the bottom of the first via 81. Furthermore—there is not air bubble within the second via 82 and the third via 83. Due to the presence of the air bubble in the first via and the lack of such air bubble in the second via and the third via—the light returned from the first via will differ from the light returned from the second via and the third via.

There is a growing need to allow a system and method for preparing a substrate with three dimensional features for immersion based inspection.

SUMMARY

There may be provided a method, and a system for preparing a substrate with patterned regions for immersion based inspection.

There may be provided method for preparing a substrate for immersion based inspection, wherein the substrate includes patterned regions, the method may include: (a) receiving, by a secondary chamber, an article comprising the substrate that may include patterned regions, a housing, and a transparent element; wherein the transparent elements is sealingly coupled to the housing to provide a sealed inner space; wherein the sealed inner space may include a gap between a first surface of the substrate to a second surface of the transparent element; wherein the gap is filled with gas during the receiving of the article; (b) evacuating the gas from the gap while reducing a pressure within the secondary chamber and maintaining an integrity of the transparent element; (c) filling the gap with fluid while increasing the pressure within a secondary chamber inner space and maintaining an integrity of the transparent element; and (d) outputting the article from the secondary chamber.

There may be provided a system for preparing a substrate for immersion based inspection, wherein the substrate includes three dimensional features, the system may include (i) a secondary chamber; wherein the secondary chamber may include (a) an interface that is configured to receive an article comprising a substrate that comprises patterned regions, (ii) a housing, and a (iii) transparent element; wherein the transparent elements is sealingly coupled to the housing to provide a sealed inner space; wherein sealed inner space comprises a gap between a first surface of the substrate to a second surface of the transparent element; wherein the gap is filled with gas during the receiving of the article; and (b) one or more fluid pressure control units that are configured to: evacuate the gas from the gap while reducing a pressure within the secondary chamber and maintaining an integrity of the transparent element; fill the gap with fluid while increasing the pressure within a secondary chamber inner space and maintaining an integrity of the transparent element; and wherein the interface is configured to output the article from the secondary chamber.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

FIG. 13 illustrates an example of a primary chamber, a secondary chamber and a robot.

DETAILED DESCRIPTION OF THE DRAWINGS

Figure 1:
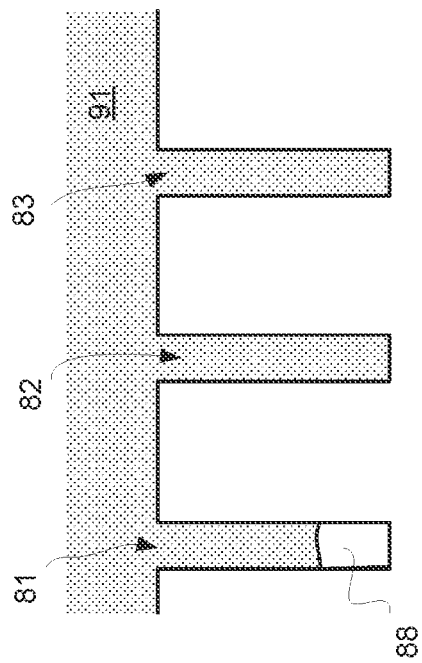
FIG. 1 is an example of a gas bubble formed in a first via.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term "and/or" means additionally or alternatively.

There may be provided systems and methods for preparing a substrate with three dimensional features for immersion based inspection. The systems and methods are applicable to an inspection process and/or metrology process that includes scanning the wafer by introducing a relative movement between the wafer and the objective lens. The systems and methods are applicable to an inspection process and/or a metrology process that does not include scanning the wafer by introducing a relative movement between the wafer and the objective lens.

It has been found by the inventors that the trapped gas should be removed from the gap before filling the gap with fluid. The removal of the gas from the gap may subject the transparent element to a substantial pressure difference and may fracture the transparent element. This can be avoided by providing a thick (for example more than a few millimeter thick) transparent element. Using a thick transparent element will increase the working distance between the objective lens and the wafer—thus complicating the objective lens, increasing the size of the objective lens and increasing the cost of the objective lens—for example by a factor of two, three and even more. The cost of the objective lens may increase from about one hundred thousand dollars to about three hundred thousand dollars.

In order to maintain the working distance between the objective lens and the wafer as small as possible—the transparent element should be thin as possible.

It has been found that by maintaining an insignificant (for example zero or substantially zero) pressure difference on the transparent element during the evacuation of the gas from the gap. The insignificant pressure difference on the transparent element may also be maintained when filling the vacuumed gap with fluid.

Figure 2:
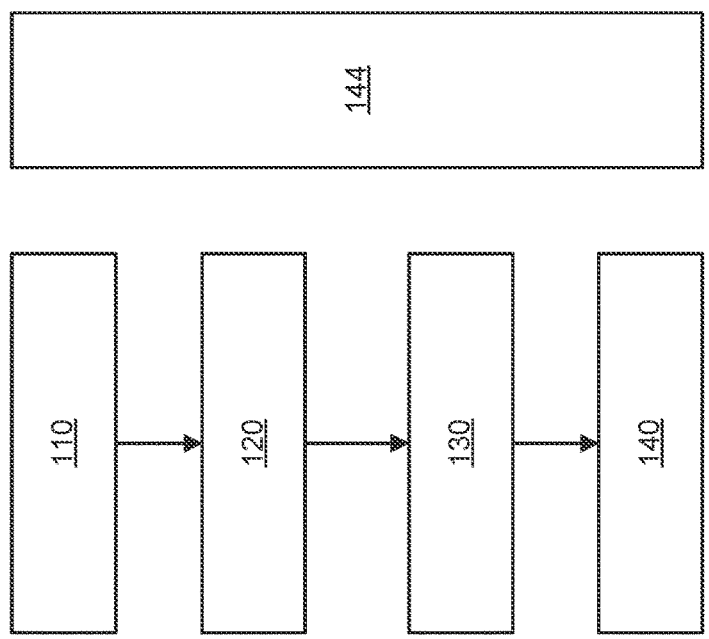
FIG. 2 illustrates an example of a method.

FIG. 2 illustrates an example of method 100 for preparing a substrate for immersion based inspection. The substrate may include three dimensional features. The three dimensional feature may be formed at the exterior of the substrate and may trap gas.

Method 100 may start by step 110 of receiving an article by a secondary chamber. The article may include the substrate, a housing, and a transparent element.

The transparent elements is sealingly coupled to the housing to provide a sealed inner space. The substrate is positioned within the sealed inner space. The sealed inner space includes a gap between a first surface of the substrate to a second surface of the transparent element.

The transparent element may be thin—for example have a thickness of less than one millimeter, or about half a millimeter, or of any sub-millimeter thickness.

The transparent element may withstand (without being fractured) a certain pressure difference. The certain pressure difference may be insignificant or may slightly exceed an insignificant pressure difference—for example—may be below a fraction (one percent, half of a percent, one thousandth and the like) of one atmosphere.

During step 110 the gap is filled with gas. For example—if may be assumed that the substrate was positioned within the housing in a non-vacuumed environment.

Step 110 may be followed by step 120 of evacuating the gas from the gap while reducing a pressure within the secondary chamber and maintaining an integrity of the transparent element.

The maintaining of the integrity of the transparent element may include maintaining, during step 120, a pressure difference on transparent element that is insignificant.

Step 120 may end when there is known or estimated that there is no trapped gas within the gap—or that is known or estimated that an amount of trapped gas (if such exists) is below a predefined threshold.

Step 120 may be followed by step 130 of filling the gap with fluid while increasing the pressure within a secondary chamber inner space and maintaining an integrity of the transparent element.

Step 130 may stop when the gap is completely filled with fluid.

At the end of step 130 the fluid may be at substantially the same pressure as the pressure level within the sealed inner space. The pressure level of the secondary chamber inner space may be set to a pressure level of a system or unit that is expected to receive the article—for example, a pressure level of a primary chamber in which the article is positioned during an immersion based inspection of the substrate.

Step 130 may be followed by step 140 of outputting the article from the secondary chamber.

Step 140 may include or may be followed by inputting the article to a primary chamber.

Method 100 may include step 144 of attaching the substrate to an electrostatic chuck of the housing during one or more steps of steps 110, 120, 130 and 140.

Figure 3:
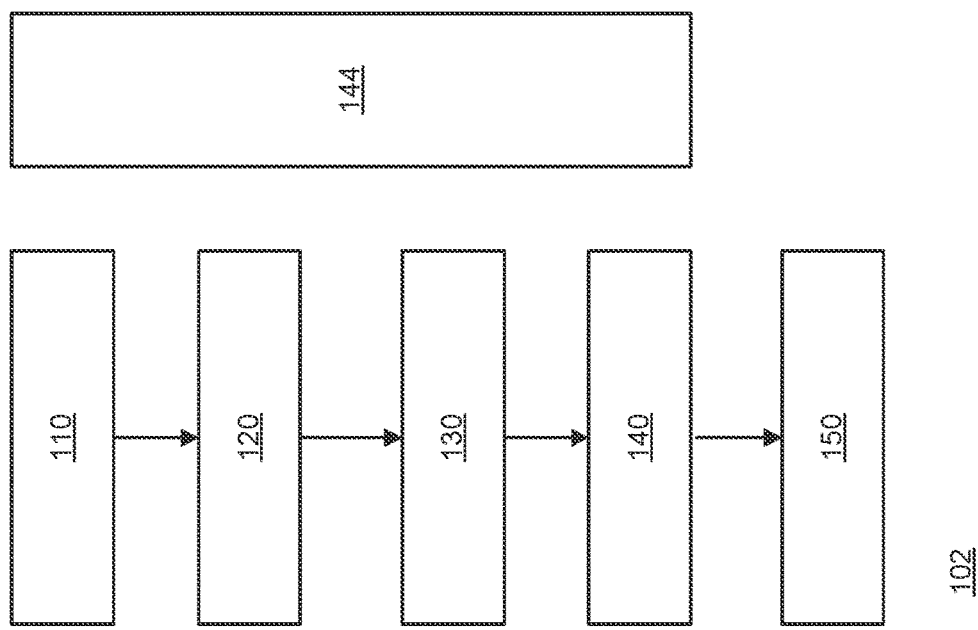
FIG. 3 illustrates an example of a method.

FIG. 3 illustrates an example of a method 102 for preparing a substrate for immersion based inspection and performing the for immersion based inspection.

Method 102 includes steps 110, 120, 130, 140—but also includes step 150. Step 150 may follow step 140. Step 140 of method 102 may include or may be followed by inputting the article to a primary chamber.

Step 150 may include performing the immersion based inspection of the substrate while the article is within the primary chamber.

Method 102 may include step 144 of attaching the substrate to an electrostatic chuck of the housing during one or more steps of steps 110, 120, 130, 140 and 150.

Figure 4:
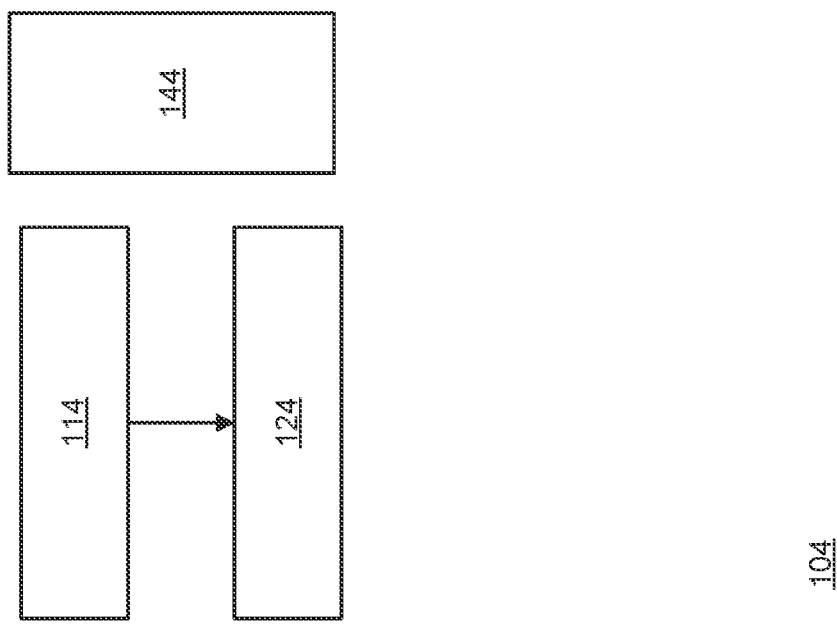
FIG. 4 illustrates an example of a method.

FIG. 4 illustrates an example of a method 104 for drying a substrate following an immersion based inspection.

Method 104 may start by step 114 of receiving, by a secondary chamber, an article. The article may include the substrate, a housing, and a transparent element. The transparent elements is sealingly coupled to the housing to provide a sealed inner space. The substrate is positioned within the sealed inner space. The sealed inner space includes a gap between a first surface of the substrate to a second surface of the transparent element. Then gap is filled with fluid.

Step 114 may be followed by step 124 of evacuating the fluid from the gap while reducing a pressure within the secondary chamber and maintaining an integrity of the transparent element.

The maintaining of the integrity of the transparent element may include maintaining, during step 124, a pressure difference on transparent element that is insignificant.

Step 124 may introduce vacuum in the gap. The vacuum will cause the fluid to evaporate—and the substrate to be dried.

Step 124 may end when the substrate is dry.

Step 124 may be followed by opening the article and extracting the substrate from the housing. This may also be followed by inputting another substrate within the housing, sealing the housing and executing one or methods 100, 102 and 104 on the other substrate.

Method 104 may include step 144 of attaching the substrate to an electrostatic chuck of the housing during one or more steps of steps 114 and 124.

Method 104 may be combined with method 100.

Method 104 may be combined with method 102.

Figure 5:
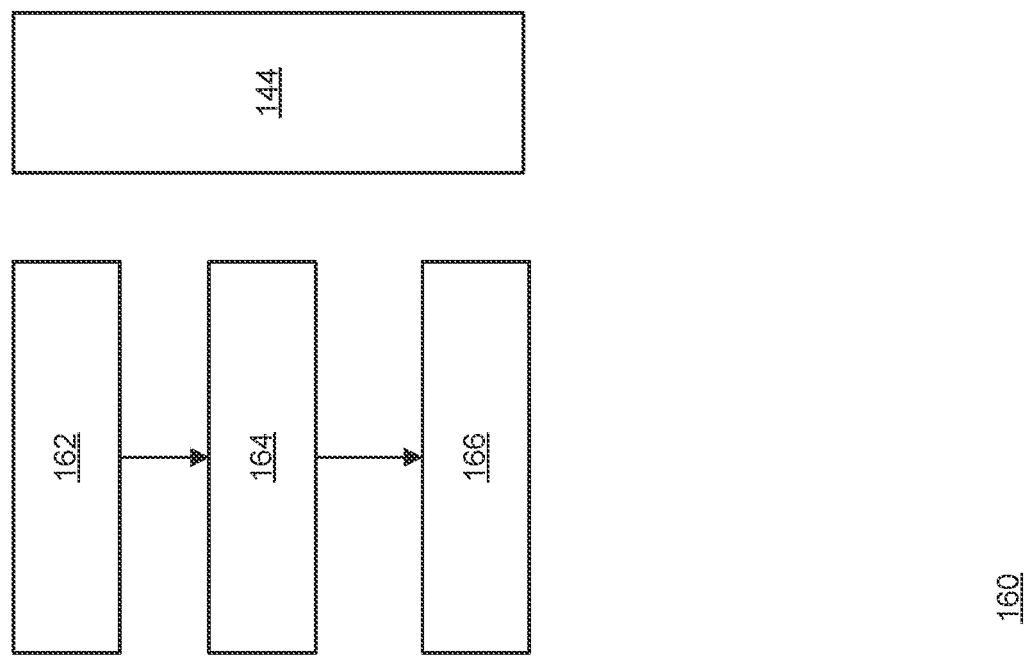
FIG. 5 illustrates an example of a method.

FIG. 5 illustrates an example of a method 160 of immersion based inspection.

Method 160 may start by step 162 of receiving an article by a primary chamber. The article may include the substrate, a housing, and a transparent element. The transparent elements is sealingly coupled to the housing to provide a sealed inner space. The substrate is positioned within the sealed inner space. The sealed inner space includes a gap between a first surface of the substrate to a second surface of the transparent element. Then gap is filled with fluid.

Step 162 may be followed by step 164 of performing the immersion based inspection of the substrate while the article is within the primary chamber.

Step 164 may be followed by step 166 of outputting the article from the primary chamber.

Method 160 may include step 144 of attaching the substrate to an electrostatic chuck of the housing during one or more steps of steps 162, 164 and 166.

Figure 6:
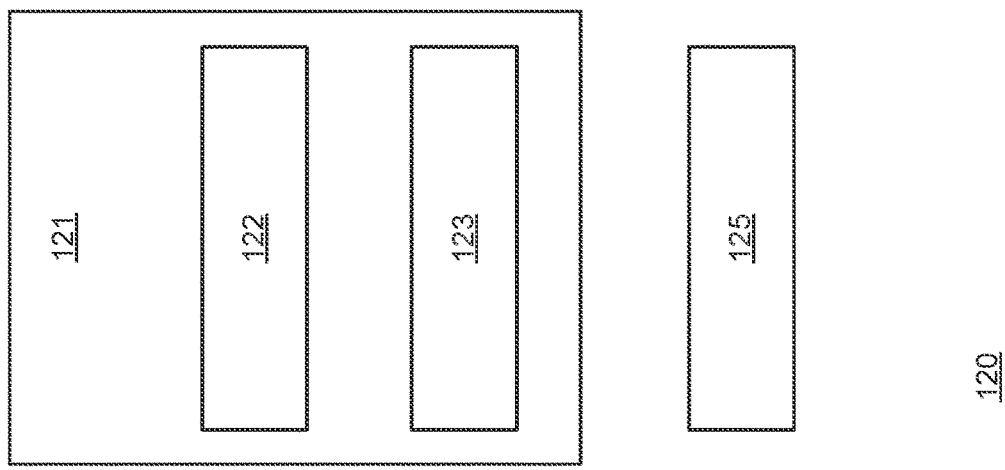
FIG. 6 illustrates an example of a method.

FIG. 6 illustrates an example of step 120 of method 100.

Step 120 may include step 121 of fluidly coupling the second surface of the transparent element and a first surface of the transparent element. The fluid coupling prevents a formation of a substantial pressure to be formed between the first surface of the transparent element and the second surface of the transparent element.

Step 121 may include fluidly coupling the gap to the secondary chamber inner space. The first surface of the transparent element is exposed to the secondary chamber inner space.

Step 121 may include step 122 of opening one or more gas conduit that passes through the housing. The opening may be performed by using a valve or any pressure control unit.

The transparent elements may be sealingly coupled to the housing by a sealed coupling. Step 121 may include step 123 of unsealing the sealed coupling.

Step 120 may include step 125 of monitoring the pressure level within at least one of the gap and the sealed inner space.

Figure 7:
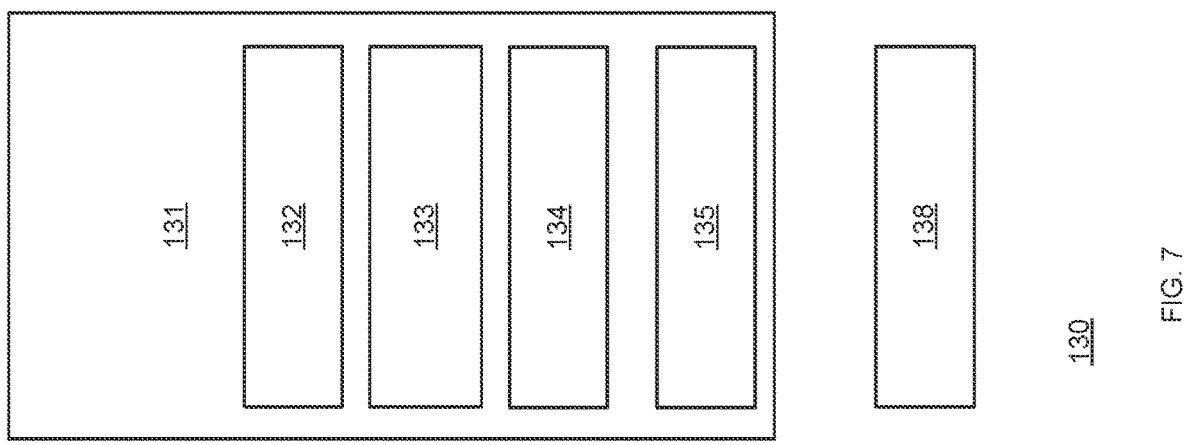
FIG. 7 illustrates an example of a method.

FIG. 7 illustrates an example of step 130 of method 100.

Step 130 may include step 131 of filling of the gap and increasing the pressure within the secondary chamber inner space while maintaining a pressure isolation between the second surface of the transparent element and a first surface of the transparent element. The pressure isolation refers to the fact that the pressure applied on the second surface is controlled independently from the pressure applied on the first surface Step 131 may include step 132 of executing the filling of the gap and the increasing the pressure within the secondary chamber inner space while maintaining a pressure equilibrium between the pressure and a pressure level within the gap.

Step 131 may include step 133 of filling of the gap and the increasing the pressure within the secondary chamber inner space while maintaining an insignificant pressure difference.

Step 130 may include step 138 of monitoring the pressure level within the gap and the pressure level within the secondary chamber inner space.

Step 138 may be followed by controlling the pressure within the gap and within the inner space based on the monitoring.

Step 131 may include step 134 of filling the gap by one filling element.

Step 131 may include step 135 of increasing the pressure within the secondary chamber inner space by another filling element.

The filling elements may be pipes, tubes, hoses, fluid conduits, or any fluid supply unit.

Figure 8:
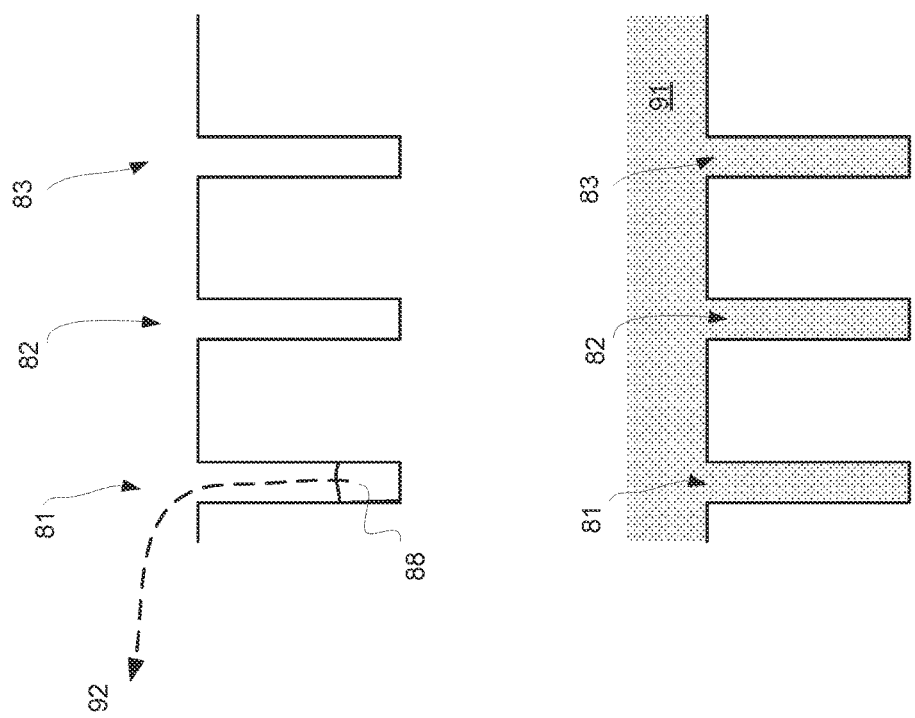
FIG. 8 illustrates an example of a filled vias.

FIG. 8 is an example of an evacuation (dashed arrow 92) of an air bubble 88 from a first via 81, and a filling of the first via 81, a second via 82 and a third via 83 with fluid 91. At the absence of an air bubble 88—each via is fully filled with the fluid 91.

Figure 9:
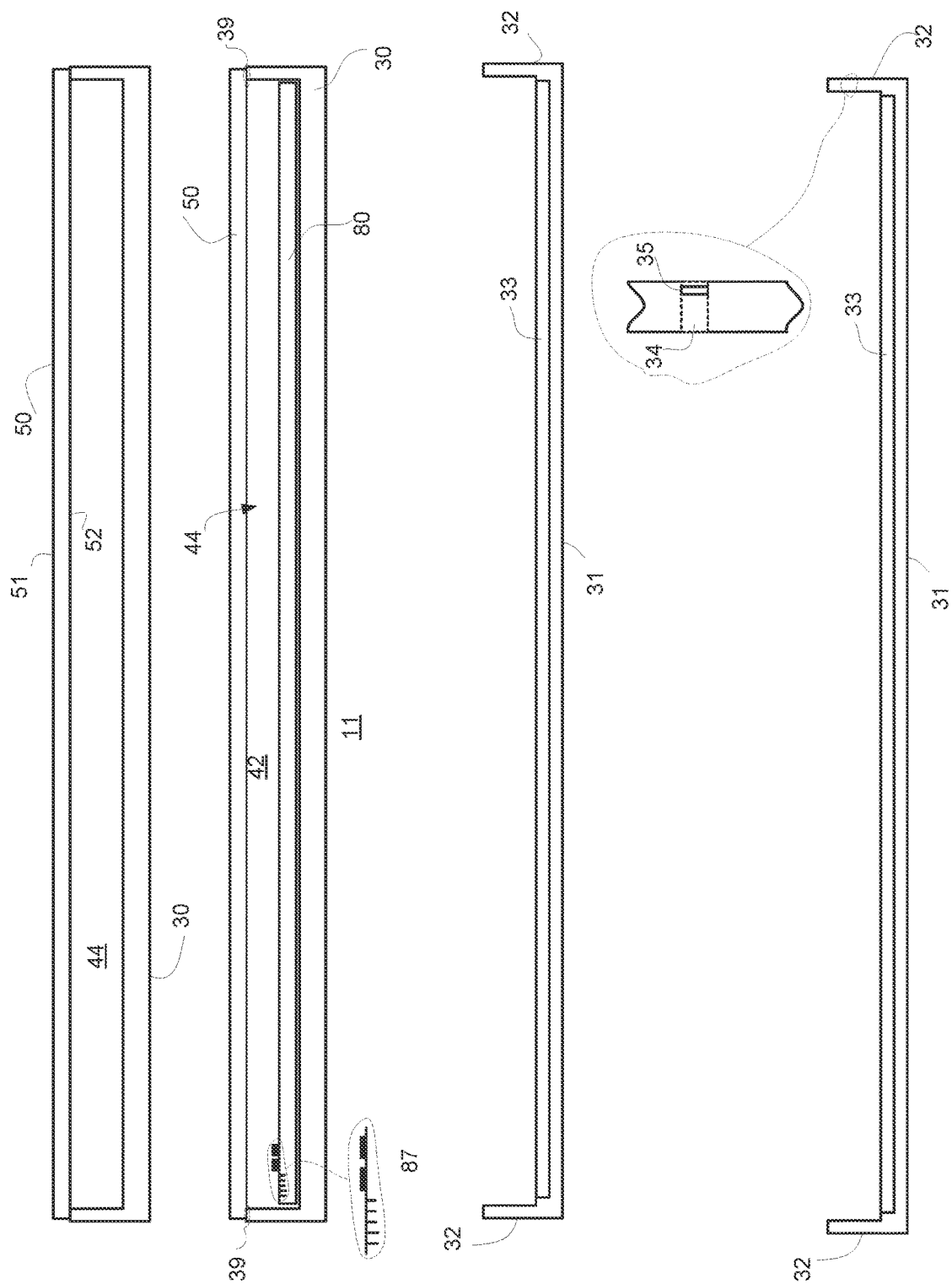
FIG. 9 illustrates examples of an article, and some parts of the article.

FIG. 9 is includes examples of (from top to bottom):

A housing 30, a transparent element 50 and a sealed inner space 44 formed by sealingly coupling the housing to the transparent element 50. The transparent element 50 has a first surface 51 and a second surface 52.

An article 11 that includes a housing 30, a transparent element 50, a substrate 80 having three dimensional structures (collectively denoted 87) such as vias and perturbances), the substrate is located within the sealed inner space 44, a gap 42 formed between the first surface of the substrate and a second surface of the transparent element 50. Sealing couplings 39 between the transparent element 50 and the housing 30 are also shown.

A housing 30 that includes one or more sidewalls 32, a bottom 31 and an electrostatic chuck 33.

A housing 30 that includes one or more sidewalls 32, a bottom 31 and an electrostatic chuck 33. A fluid conduit 34 is formed within a sidewall 32 of the housing. The fluid conduit 34 may include a valve 35 or any other selective sealing element.

Figure 10:
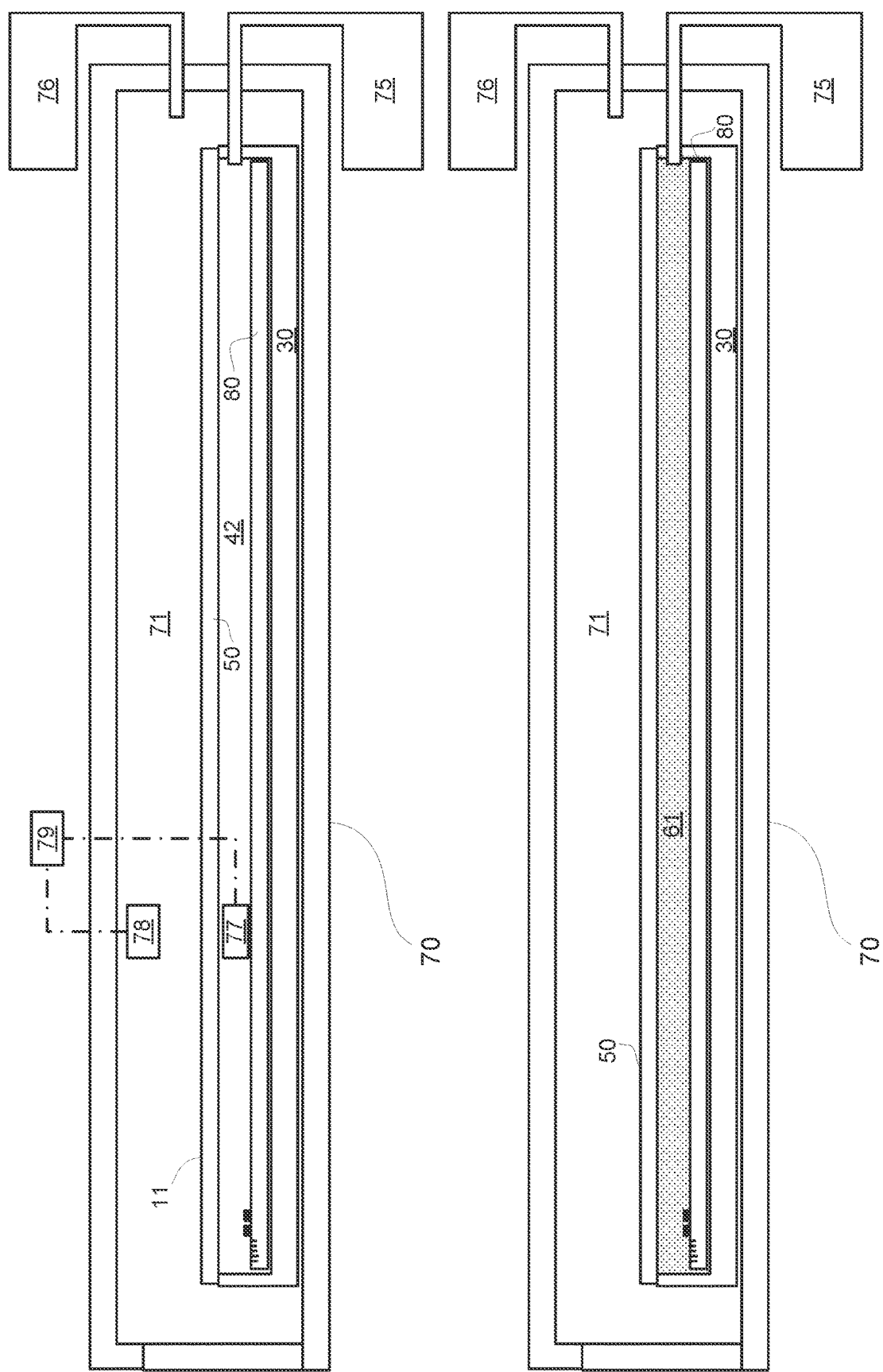
FIG. 10 illustrates examples of an article, and a primary chamber.

FIG. 10 is includes examples of a gap that is vacuumed and a gap that is filled with fluid.

FIG. 10 illustrates a secondary chamber 70 that includes a secondary housing inner space 71, a first fluid pressure control unit 75 and a second fluid pressure control unit 76. FIG. 10 also illustrates an article 11 that includes a housing 30, a transparent element 50, gap 42, inner space pressure sensor 78, gap pressure sensor 77 and processor 79 that may process detection signals and feed the second fluid pressure control unit 76 and/or the first fluid pressure control unit 75 with measurements results.

The first fluid pressure control unit 75 is configured to evacuate the gas from the gap 42 and may also be configured to fill the gap 42 with fluid 61. It should be noted that a vacuum unit may be used for evacuating the gas and a filling unit may be used to fill the gap with fluid 61.

The second fluid pressure control unit 76 is configured to evacuate the gas from the secondary chamber inner space 71 and may also be configured to fill the secondary chamber inner space 71 with fluid. It should be noted that a vacuum unit may be used for evacuating the gas and a filling unit may be used to fill the secondary chamber inner space with fluid. The fluid may be gas or liquid.

In FIG. 10 the gap 42 is isolated from the secondary chamber inner space 71.

Figure 11:
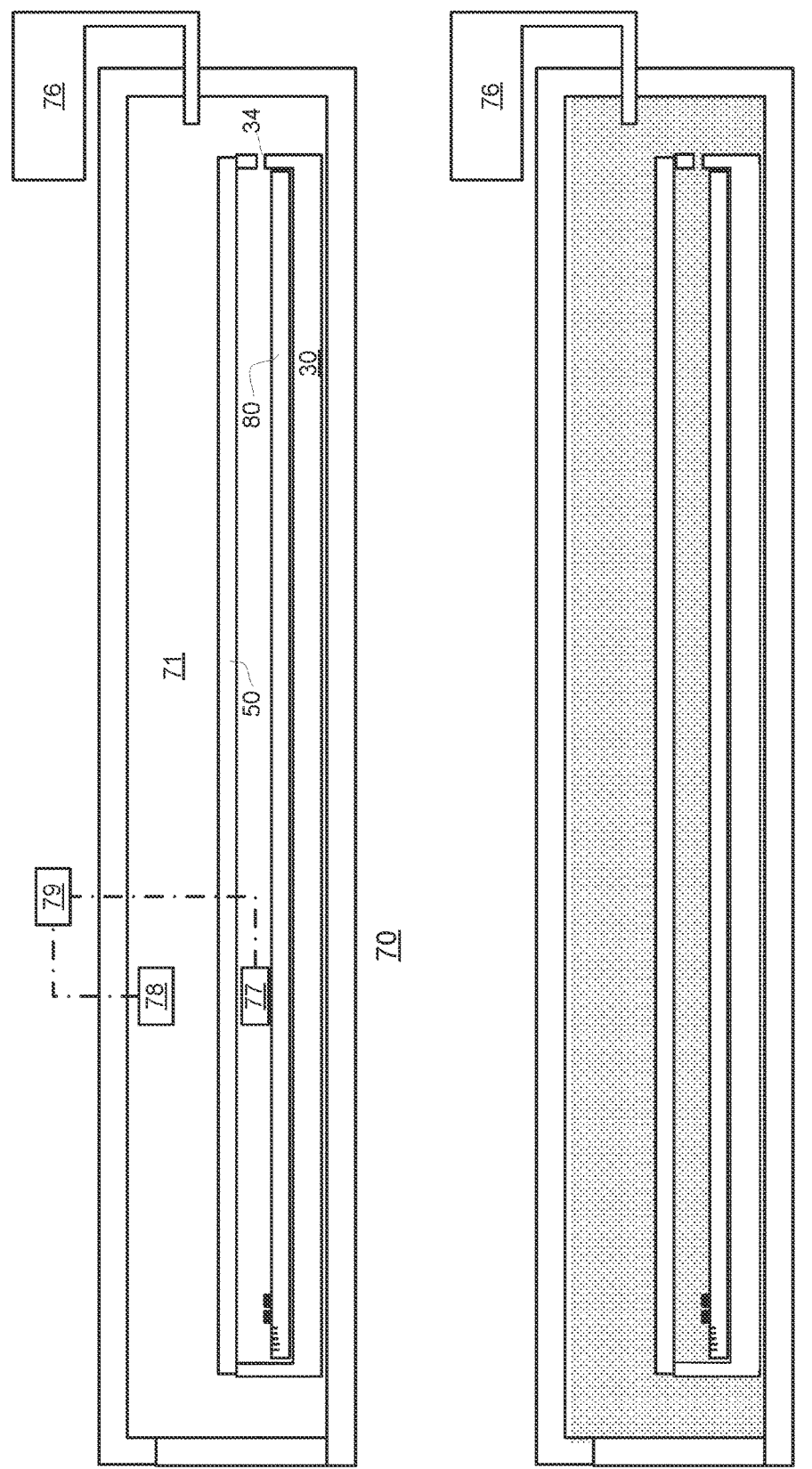
FIG. 11 illustrates examples of an article, and a primary chamber.

FIG. 11 illustrates an example of a secondary chamber 70 that includes a secondary housing inner space 71 and a second fluid pressure control unit 76. FIG. 11 also illustrates an article 11 that includes a housing 30, a transparent element 50, gap 42, inner space pressure sensor 78, gap pressure sensor 77 and processor 79 that may process detection signals and feed the second fluid pressure control unit 76 with measurements results.

In FIG. 11 the gap 42 is fluidly coupled (via fluid conduit) to secondary chamber inner space 71. In this case the gas is evacuated from the gap and the secondary chamber inner space by using the second fluid pressure control unit 76, and both the gap and the secondary chamber inner space may be filled with fluid 61.

There may be any number of fluid conduits between the gap and the second fluid pressure control unit 76.

Figure 12:
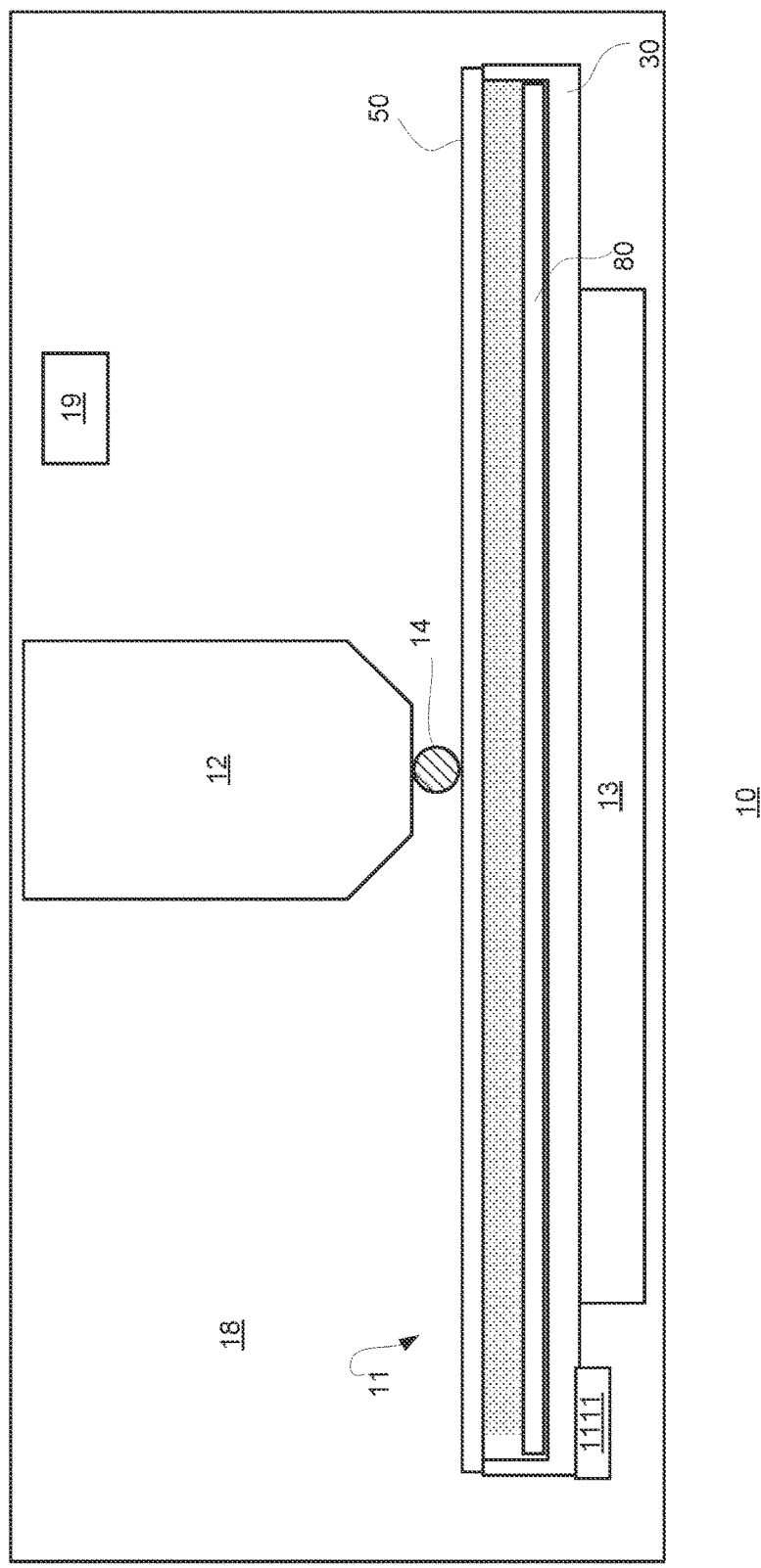
FIG. 12 illustrates examples of a system and an article.

FIG. 12 is an example of a system 10 such as an immersion microscope.

The system may include a primary chamber 18, a lens 12 (for example an objective lens), a holder 13 for holding article 11, and a control unit 19. It is noted that system 10 can include additional lenses, mechanics, image processors and/or eyepieces as well as additional or alternative components that are not shown for simplicity of explanation. Typically, system 10 can include a radiation source such as a laser, a lamp, and the like. It is further noted that system 10 can perform inspection and/or metrology applications.

When water enters a vacuumed environment it evaporates and reducing the temperature of its surroundings. FIG. 12 also illustrates system 10 as including heat control unit 1111 that may control the temperature of any one of housing 30, substrate 80, transparent element 50, and the like. The heat control may be applied, for example for prevention of freezing.

Lens 12 can be an objective lens and can be used to direct radiation towards substrate 80 and, additionally or alternatively, from substrate 80. System 10 can use bright field techniques and, additionally or alternatively, use dark field illumination techniques. System 10 can also continuously scan substrate 80 or use pulsed illumination and/or detection methods.

Conveniently, substrate 80 is scanned by lens 12 while being held stable. This stability as well as an adequate filling the gap between substrate 80 and transparent element 50 that prevents first fluid turbulence and can enable higher scanning speeds.

Conveniently, transparent element 50 is a part of a housing 30 or is sealingly coupled to housing 50 by using optical gluing.

Conveniently, an image of substrate 80 is acquired by detecting light (or other radiation) that is reflected or scattered from the first surface of substrate 80, passes through fluid 61, transparent element 50 and the other fluid element (for example drop) 14 before reaching lens 12.

FIG. 13 illustrates system 10 as including the primary chamber 18 and the secondary chamber 70. A mechanical element such as a robot 111 may transfer the article from one chamber to another.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

I claim:

1. A method for preparing a substrate for immersion based inspection, wherein the substrate comprises patterned regions, the method comprises:
   receiving, by a chamber, an article comprising the substrate that comprises patterned regions, a housing, and a transparent element; wherein the transparent element is sealingly coupled to the housing to provide a sealed inner space; wherein the sealed inner space comprises a gap between a first surface of the substrate to a second surface of the transparent element; wherein the gap is filled with gas during the receiving of the article;
   evacuating the gas from the gap while reducing a pressure within the chamber and maintaining an integrity of the transparent element;
   filling the gap with fluid while increasing the pressure within a chamber inner space and maintaining an integrity of the transparent element; and
   outputting the article from the chamber.

2. The method according to claim 1 wherein the filling the gap comprises fluidly coupling the second surface of the transparent element and a first surface of the transparent element.

3. The method according to claim 2 wherein the fluidly coupling comprises fluidly coupling the gap to the chamber inner space; wherein a first surface of the transparent element is exposed to the chamber inner space.

4. The method according to claim 2 wherein the fluidly coupling comprises opening one or more gas conduit that passes through the housing.

5. The method according to claim 2 wherein the transparent element is sealingly coupled to the housing by a sealed coupling, wherein the fluidly coupling comprises unsealing the sealed coupling.

6. The method according to claim 1 wherein the filling of the gap and the increasing the pressure within the chamber inner space are executed while maintaining a pressure isolation between the second surface of the transparent element and a first surface of the transparent element.

7. The method according to claim 6 wherein the filling of the gap and the increasing the pressure within the chamber inner space are executed while maintaining a pressure equilibrium between the pressure and a pressure level within the gap.

8. The method according to claim 6 wherein the filling of the gap and the increasing the pressure within the chamber inner space are executed while maintaining a pressure difference below a threshold, wherein the pressure difference is a difference between the pressure and a pressure level within the gap.

9. The method according to claim 6 comprising monitoring the pressure and monitoring a pressure level within the gap.

10. The method according to claim 1 wherein the filling of the gap is executed by one filling element the increasing the pressure within the chamber inner space is executed by another filling element.

11. The method according to claim 1 wherein the outputting of the article from the chamber comprises inputting the article to a primary chamber; and performing the immersion based inspection while the article is within the primary chamber.

12. The method according to claim 11 comprising stopping the filling of the gap with fluid when a pressure of the fluid within the gap equals a pressure level within the primary chamber.

13. The method according to claim 1 comprising attaching the substrate to an electrostatic chuck of the housing.

14. The method according to claim 1 comprising preventing freezing of fluid within the gap.

15. A system for preparing a substrate for immersion based inspection, wherein the substrate comprises three dimensional features, the system comprises a chamber; wherein the chamber comprises:
   an interface that is configured to receive an article comprising a substrate that comprises patterned regions, a housing, and a transparent element; wherein the transparent element is sealingly coupled to the housing to provide a sealed inner space; wherein sealed inner space comprises a gap between a first surface of the substrate to a second surface of the transparent element;
wherein the gap is filled with gas during the receiving of the article;
one or more fluid pressure control units that are configured to:
evacuate the gas from the gap while reducing a pressure within the chamber and maintaining an integrity of the transparent element;
fill the gap with fluid while increasing the pressure within a chamber inner space and maintaining an integrity of the transparent element; and
wherein the interface is configured to output the article from the chamber.

\* \* \* \* \*

UNITED STATES PATENT AND TRADEMARK OFFICE
CERTIFICATE OF CORRECTION

| | |
|---|---|
| PATENT NO. | : 11,687,005 B1 |
| APPLICATION NO. | : 17/671468 |
| DATED | : June 27, 2023 |
| INVENTOR(S) | : Tal Kuzniz |

It is certified that error appears in the above-identified patent and that said Letters Patent is hereby corrected as shown below:

On the Title Page

Column 1, Item (72) Inventor: please remove Tai Kuzniz and add Tal Kuzniz

Signed and Sealed this
Twenty-ninth Day of August, 2023

Katherine Kelly Vidal
*Director of the United States Patent and Trademark Office*